United States Patent
Steingart et al.

(10) Patent No.: US 11,193,979 B2
(45) Date of Patent: Dec. 7, 2021

(54) DETERMINATION OF CHARACTERISTICS OF ELECTROCHEMICAL SYSTEMS USING ACOUSTIC SIGNALS

(71) Applicants: Feasible, Inc., Emeryville, CA (US); The Trustees of Princeton University, Princeton, NJ (US)

(72) Inventors: Daniel A. Steingart, Princeton, NJ (US); Greg Davies, Plainsboro, NJ (US); Shaurjo Biswas, El Cerrito, CA (US); Andrew G. Hsieh, Berkeley, CA (US); Barry Van Tassell, El Cerrito, CA (US); Thomas Hodson, Princeton, NJ (US); Shan Dou, Berkeley, CA (US)

(73) Assignees: Feasible, Inc., Emeryville, CA (US); The Trustees of Princeton University, Princeton, NJ (US)

( * ) Notice: Subject to any disclaimer, the term of this patent is extended or adjusted under 35 U.S.C. 154(b) by 258 days.

(21) Appl. No.: 16/117,421

(22) Filed: Aug. 30, 2018

(65) Prior Publication Data

US 2019/0072614 A1 Mar. 7, 2019

Related U.S. Application Data

(60) Provisional application No. 62/553,287, filed on Sep. 1, 2017.

(51) Int. Cl.
*G01R 31/385* (2019.01)
*G01N 29/07* (2006.01)
(Continued)

(52) U.S. Cl.
CPC ......... *G01R 31/385* (2019.01); *G01N 29/043* (2013.01); *G01N 29/07* (2013.01);
(Continued)

(58) Field of Classification Search
CPC .............. G01R 31/385; H01M 10/425; H01M 10/486; H01M 10/48; H01M 2010/4271
See application file for complete search history.

(56) References Cited

U.S. PATENT DOCUMENTS 9,893,385 B1 * 2/2018 Nayar ................ H01M 10/486
10,247,783 B2 * 4/2019 Mensah-Brown ... G01N 29/022
(Continued)

FOREIGN PATENT DOCUMENTS

DE 10 2014 218699 A1 3/2016

OTHER PUBLICATIONS

International Search Report and Written Opinion dated Oct. 26, 2018 in International Application No. PCT/US2018/048804.

*Primary Examiner* — Eman A Alkafawi
*Assistant Examiner* — Aeysha N Sultana
(74) *Attorney, Agent, or Firm* — Polsinelli PC

(57) ABSTRACT

Systems and methods for prediction of state of charge (SOH), state of health (SOC) and other characteristics of batteries using acoustic signals, includes determining acoustic data at two or more states of charge and determining a reduced acoustic data set representative of the acoustic data at the two or more states of charge. The reduced acoustic data set includes time of flight (TOF) shift, total signal amplitude, or other data points related to the states of charge. Machine learning models use at least the reduced acoustic dataset in conjunction with non-acoustic data such as voltage and temperature for predicting the characteristics of any other independent battery.

20 Claims, 10 Drawing Sheets

(51) Int. Cl.
| | |
|---|---|
| *G01N 29/11* | (2006.01) |
| *G01N 29/46* | (2006.01) |
| *G01N 29/12* | (2006.01) |
| *G01N 29/04* | (2006.01) |
| *G01R 31/3835* | (2019.01) |
| *G06N 20/00* | (2019.01) |
| *G01R 31/392* | (2019.01) |
| *G01R 31/3842* | (2019.01) |
| *G01N 29/44* | (2006.01) |
| *G01N 29/50* | (2006.01) |
| *H01M 10/42* | (2006.01) |
| *G01N 29/48* | (2006.01) |
| *G06N 5/04* | (2006.01) |
| *H01M 10/48* | (2006.01) |

(52) U.S. Cl.
CPC ............. *G01N 29/11* (2013.01); *G01N 29/12* (2013.01); *G01N 29/4418* (2013.01); *G01N 29/4436* (2013.01); *G01N 29/4481* (2013.01); *G01N 29/46* (2013.01); *G01N 29/48* (2013.01); *G01N 29/50* (2013.01); *G01R 31/3835* (2019.01); *G06N 5/046* (2013.01); *G06N 20/00* (2019.01); *H01M 10/425* (2013.01); *H01M 10/4285* (2013.01); *H01M 10/486* (2013.01); *G01N 2291/011* (2013.01); *G01N 2291/02441* (2013.01); *G01N 2291/02827* (2013.01); *G01N 2291/02854* (2013.01); *G01N 2291/102* (2013.01); *G01N 2291/2697* (2013.01); *G01R 31/3842* (2019.01); *G01R 31/392* (2019.01); *H01M 10/48* (2013.01); *H01M 2010/4271* (2013.01)

(56) References Cited

U.S. PATENT DOCUMENTS

| | | | |
|---|---|---|---|
| 2016/0084911 | A1 | 3/2016 | Mensah-Brown |
| 2016/0197382 | A1* | 7/2016 | Sood ................. H01M 10/4257 429/92 |
| 2016/0223498 | A1* | 8/2016 | Steingart ................ G01N 29/46 |
| 2016/0349330 | A1* | 12/2016 | Barfield, Jr. ........... G07C 5/008 |

* cited by examiner

Equation 1: $V_p = \sqrt{\dfrac{K + \frac{4}{3}G}{\rho}}$

FIG. 1A

Equation 2: $K = \dfrac{E}{3(1-2v)}$

FIG. 1B

Equation 3: $G = \dfrac{E}{2(1+v)}$

FIG. 1C

Equation 4: $K^{HS+} = \Lambda(G_{max})$

FIG. 1D

Equation 5: $K^{HS-} = \Lambda(G_{min})$

FIG. 1E

Equation 6: $G^{HS+} = \Gamma(\zeta(K_{max}, G_{max}))$

FIG. 1F

Equation 7: $G^{HS-} = \Gamma(\zeta(K_{min}, G_{min}))$

FIG. 1G

Equation 8: $\Lambda(z) = \left\langle \dfrac{1}{K(r) + \frac{4}{3}z} \right\rangle^{-1} - \dfrac{4}{3}z$

FIG. 1H

Equation 9: $\Gamma(z) = \left\langle \dfrac{1}{G(r) + \frac{4}{3}z} \right\rangle^{-1} - z$

FIG. 1I

Equation 10: $\zeta(K, G) = \dfrac{G}{6}\left(\dfrac{9K + 8G}{K + 2G}\right)$

FIG. 1J

Equation 11: $[f * g](\tau) = \int_{-\infty}^{\infty} f(t) g(t + \tau) dt$

FIG. 1K

Equation 12: $A = \int_{t_i}^{t_f} |f(t)| dt$

FIG. 1L

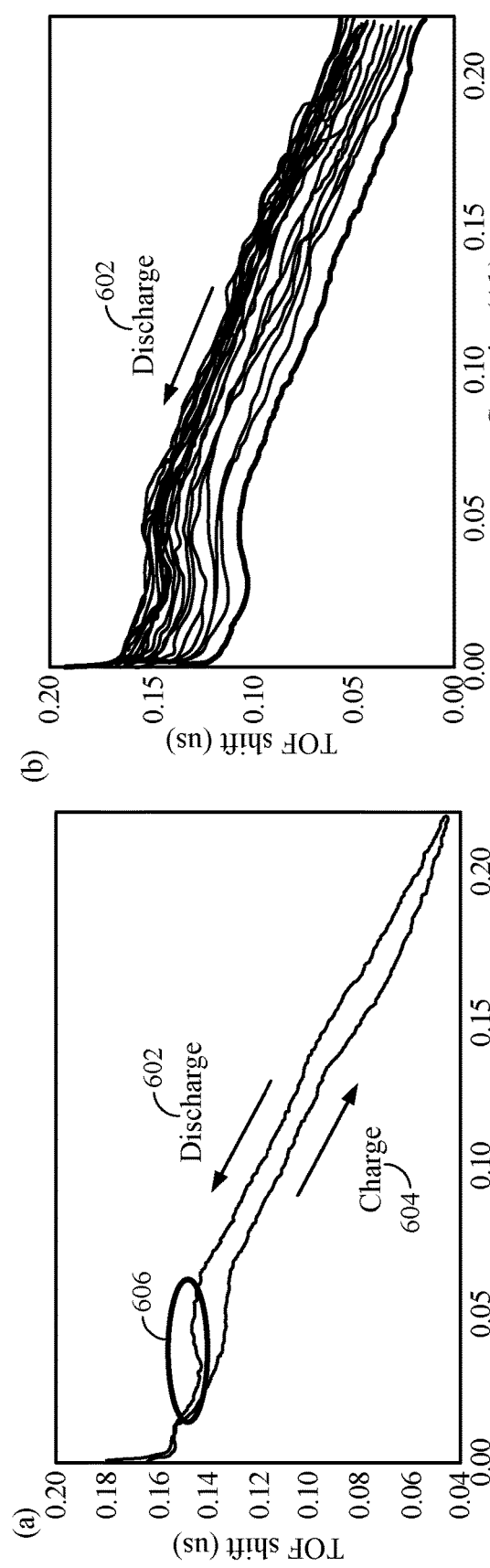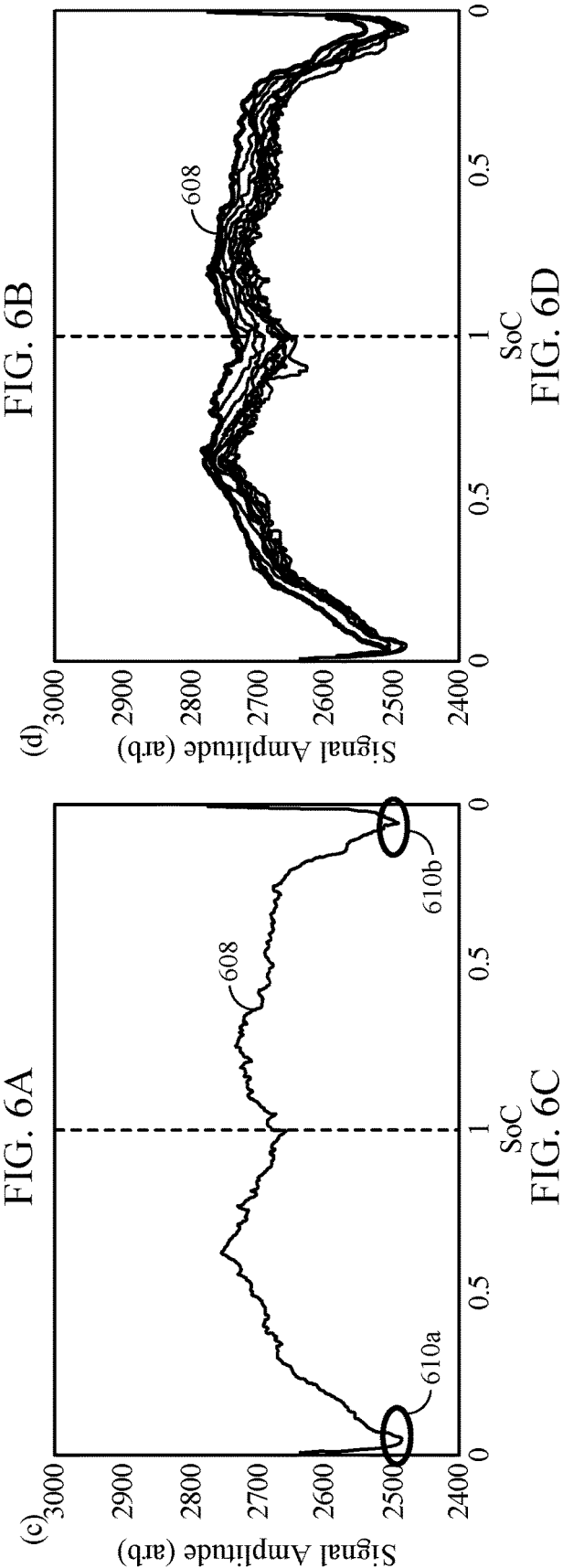

DETERMINATION OF CHARACTERISTICS OF ELECTROCHEMICAL SYSTEMS USING ACOUSTIC SIGNALS

CROSS-REFERENCE TO RELATED APPLICATIONS

The present application for patent claims the benefit of Provisional Patent Application No. 62/553,287 entitled "USE OF ULTRASONIC METHODS FOR THE DETERMINATION OF THE STATE OF CHARGE AND STATE OF HEALTH OF ELECTROCHEMICAL SYSTEMS" filed Sep. 1, 2017, and assigned to the assignee hereof and hereby expressly incorporated herein by reference in its entirety.

STATEMENT REGARDING FEDERALLY SPONSORED RESEARCH OR DEVELOPMENT

This invention was made with U.S. Federal Government support under Grant No. DE-AR0000621 awarded by the Advanced Research Projects Agency—Energy. The U.S. Federal Government has certain rights in the invention.

FIELD OF DISCLOSURE

Disclosed aspects are directed to inspection and diagnostics of electrochemical systems. More specifically, exemplary aspects are directed to the use of ultrasonic signals in determining characteristics such as the state of charge (SOC) and state of health (SOH) of electrochemical systems.

BACKGROUND

Tracking characteristics such as state of charge (SOC), state of health (SOH), internal damages, etc., of electrochemical systems such as batteries is important for various reasons, including improvement of battery life, higher production efficiencies, early prediction of failures, etc. However, the ability to reliably track or determine such characteristics efficiently and at low cost, in operando, presents a challenge.

For instance, in conventional implementations, SOC prediction may include voltage monitoring (direct measurement) combined with coulomb-counting (bookkeeping). This can present challenges for a variety of reasons. First, for voltage measurements, the flatness of voltage readings over a majority of battery capacity, especially for lithium iron phosphate (LFP) cells, presents difficulties. Furthermore, voltage fade, changing cell electrical impedances, and varying discharge rates impact the accuracy of voltage-based SOC measurements. Second, coulomb counting is also an inexact science, as discharge rate, environmental factors such as temperature, and cell degradation can all impact the actual charge capacity for any given discharge period. This can lead to a cycle of abuse, whereby discharge conditions lead to an incorrect estimate of SOC, and therefore the cell becomes inadvertently over-discharged, which can cause damage to the cell and lead to further inaccuracy in the SOC prediction, resulting in continued over-discharging and cell damage.

Accordingly, there is a need for low-cost and high accuracy techniques which can directly measure the mechanical and physical states of the battery, to enhance the determination of SOC, SOH, and cell failure.

SUMMARY

Exemplary aspects of this disclosure are directed to systems and methods for predicting state of charge (SOC), state of health (SOH) and other characteristics of batteries using acoustic signals, and includes determining acoustic data at two or more states of charge and determining a reduced acoustic data set representative of the acoustic data at the two or more states of charge. The reduced acoustic data set includes time of flight (TOF) shift, total signal amplitude, or other data points related to the states of charge. Machine learning models use at least the reduced acoustic dataset in conjunction with non-acoustic data such as voltage and temperature for predicting the characteristics of any other independent battery.

For example, an exemplary aspect is directed to a method of non-invasive analysis of electrochemical systems, the method comprising subjecting at least a first battery to at least a portion of a charge-discharge cycle. Acoustic signals are transmitted through at least a portion of the first battery and corresponding response signals are received at two or more time instances during at least the portion of the charge-discharge cycle, the two or more time instances corresponding to two or more states of charge of the first battery. At least a reduced acoustic dataset is determined, the reduced acoustic dataset comprising one or more data points representative of one or more of the transmitted acoustic signals or response signals at the two or more states of charge.

Another exemplary aspect is directed to a method of non-invasive analysis of electrochemical systems, the method comprising predicting characteristics of a second battery using at least a first database and one or more of acoustic data or non-acoustic data of the second battery, wherein the first database comprises at least a reduced acoustic dataset comprising one or more data points representative of one or more of acoustic signals transmitted through at least a portion of the first battery and response signals to the transmitted signals, the transmitted signals and the response signals at two or more states of charge of the first battery.

Yet another exemplary aspect is directed to an apparatus comprising at least a first battery, a battery management system configured to subject the first battery to at least a portion of a charge-discharge cycle, and one or more transducers configured to transmit acoustic signals through at least a portion of the first battery and receive corresponding response signals at two or more time instances during at least the portion of the charge-discharge cycle, the two or more time instances corresponding to two or more states of charge of the first battery. The apparatus further comprises a computer configured to determine at least a reduced acoustic dataset comprising one or more data points representative of one or more of the transmitted acoustic signals or response signals at the two or more states of charge.

BRIEF DESCRIPTION OF THE DRAWINGS

The accompanying drawings are presented to aid in the description of various aspects of the invention and are provided solely for illustration and not limitation.

FIGS. 1A-L illustrate equations referred to in this disclosure.

FIGS. 6A-D illustrate correlations between exemplary features of acoustic signals including TOF shifts and total signal amplitude, and characteristics including SOC and capacity of a battery, according to aspects of this disclosure.

DETAILED DESCRIPTION

Figure 2:
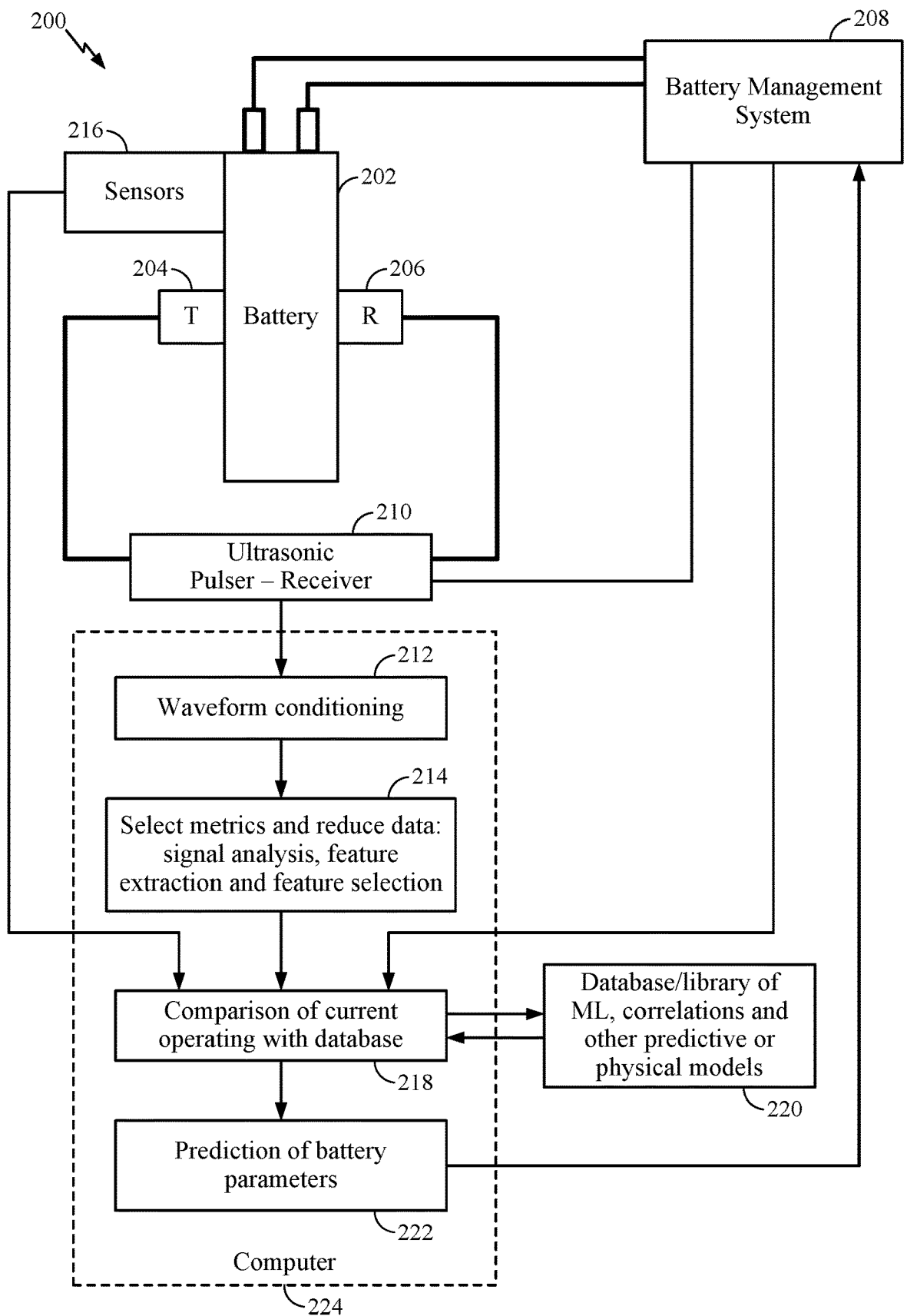
FIG. 2 illustrates a system for performing acoustic analysis of a battery according to aspects of this disclosure.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Exemplary aspects of this disclosure are directed to determination or prediction of one or more characteristics of electrochemical systems such as batteries, the characteristics comprising SOH, SOC, construction quality, remaining useful lifetime, state of power, state of safety, etc. In some aspects, acoustic data derived from probing the battery using acoustic signals may be used in the above determination of the characteristics of the battery.

It will be understood that in this disclosure, acoustic signals refer to sound signals such as ultrasonic signals which are specifically discussed in example aspects below. Correspondingly, wave propagation or waveforms of the acoustic signals refer to the sound propagation. In certain aspects, the wave propagation of the acoustic signals may refer to elastic waves, as will be explained further with reference to elastic wave propagation theory. Thus, terms such as "acoustic," "sound," "ultrasonic," "elastic" may be used interchangeably in this disclosure, e.g., in the context of waves propagating through an electrochemical system or battery under test.

Additionally in some aspects, non-acoustic data, such as voltage, impedance, temperature, rates of charge/discharge, etc., of the battery may be combined with the acoustic data for determination of the above characteristics. Further, exemplary aspects are directed to a reduced acoustic dataset constructed from the acoustic signals (and optionally, the non-acoustic data). The reduced acoustic dataset comprises a reduced set of one or more data points indicative of the acoustic dataset, for example, at each SOC of the battery. The reduced acoustic dataset may include one or more of a time of flight (TOF) shift, total amplitude, frequency content, first break time, centroid frequency, full width at half the maximum of the main response peak in time domain, full width at half the maximum of the main peak in the frequency domain, standard deviation, skewness, or kurtosis of the frequency distribution, decay rate of the response signal in time domain, or other data points in the time domain such as, the area under positive amplitude, area under negative amplitude, etc. The reduced acoustic dataset involves a significantly smaller number of data points in comparison to raw acoustic data derived from full acoustic waveforms, and thus leads to greater efficiencies in disclosed techniques.

In addition to determining the above battery characteristics, aspects are also directed to determining physical properties of a battery (including battery components such as the anode, cathode, separator, electrolyte, etc.), such as bulk modulus, density, etc., based on applications of elastic wave propagation theory. The above-described analyses may be performed by subjecting the battery to charge-discharge cycles, in order to obtain data points at different states of charge. From machine learning models which will be discussed in detail below, the battery characteristics and/or physical properties may be predicted while the battery is in use (e.g., at various states of charge during charge/discharge cycles) or in an isolated/static state (i.e., not during use). Various batteries may be classified using these techniques, e.g., based on construction quality, defect state, degradation state, etc. Other applications beyond SOC, SOH monitoring and classifications using the disclosed techniques are also within the scope of this disclosure.

The disclosed techniques are based on a relationship (the physics of which will be explained in detail below) between ultrasonic wave propagation through a battery (or portions thereof) and changes in mechanical-electrochemical properties of the battery (keeping in mind that references to "battery" and "cell" may be used interchangeably in this disclosure without intending any changes to the scope of example aspects discussed herein). Conversely, the variations in mechanical-electrochemical properties lead to variations in acoustic data such as measured propagation time, dissipation, amplitude, attenuation, frequency content, etc., of the ultrasonic signals.

In exemplary aspects, electrochemical-mechanical relationships in batteries are studied using ultrasonic signals (e.g., high frequency). Although any suitable device may be used for transmitting the ultrasonic signals at a suitable frequency and for sensing responses to the transmitted signals, a few example devices which may be used in example aspects will be mentioned. Transducers for transmitting and receiving ultrasonic signals provide a low cost and small size option, because the thickness of the active element in transducers is inversely proportional to the wavelength of the generated ultrasonic signals. Microelectromechanical systems (MEMS) piezoelectric transducers are an example of transducers which may be configured to send ultrasonic signals through batteries (or portions thereof) and/or receive response signals thereof. Other types of transducers such as capacitive micromachined ultrasonic transducers (CMUTs), macroscopic piezoelectric transducers may also be used in other examples. In some examples, accelerometers, optical/laser-based sensors, strain-based sensors, etc. may also be used for receiving the response signals.

In an example, the changes in characteristics (e.g., SOC and SOH) of a battery may be expressed as a function of variations in acoustic data such as first arrival time or time of flight (TOF) of an ultrasonic wave through a battery. To explain, according to elastic wave propagation theory, the propagation speed of an acoustic signal or sound wave through a material depends upon the physical properties such as bulk modulus, shear modulus, and density of the material. The electrochemical changes within multiple layers or component materials of a battery results in their physical properties changing, e.g., as the battery undergoes charge/discharge cycles. These changes that occur as the battery goes through charge and discharge cycles, also referred to as intra-cycle changes. Other changes in the materials of the battery may occur as the battery ages or is subjected to external changes. For example, degradation (e.g. due to exposure to elevated temperatures) or differences in manufacturing processes and internal components can also result in changes in the overall physical properties of batteries. Thus, the changes in physical properties may take place over multiple charge-discharge cycles, as the battery ages and/or as external conditions change. Therefore, the changes in the physical properties leads to changes in the acoustic data pertaining to acoustic signals transmitted through the battery, e.g., in the form of shifts in transmitted and/or reflected ultrasonic signals.

The above-mentioned machine learning algorithms will now be discussed in further detail. The reduced acoustic dataset may be used to train machine learning algorithms for efficient and low-cost predictions of the characteristics of the battery. The reduced acoustic dataset may be derived from the acoustic data, e.g., based on measurement of ultrasonic signal propagation (or more generally, acoustic response signals), such measurements including time of flight, amplitude, changes in waveform shape, comparisons of waveform properties with reference waveforms, analysis of frequency content, dispersion, attenuation, etc. In addition to extracting the above reduced acoustic dataset from the acoustic data, the physical properties (e.g., speed of sound, density, elastic modulus, bulk modulus, shear modulus, porosity, thickness, etc.) of individual layers or components within battery cells (e.g., anode, cathode, current collectors, separator, electrolyte, etc.) may also be estimated from the acoustic data. These physical properties may be estimated using models based on elastic wave propagation theory, as previously mentioned.

A library/database of acoustic data, or more specifically a library/database reduced acoustic dataset in some cases, may be generated for two or more batteries (e.g., similar cells) may be created. The acoustic data may first be filtered or windowed before the reduced acoustic dataset is extracted according to exemplary techniques. The reduced acoustic dataset may be fed into the machine learning algorithm. The output of the machine learning algorithm may be used for predictions characteristics such as SOC, SOH, battery life, battery damage, safety risk, etc., for different batteries, despite variations in the battery performance and cycle history between different batteries.

With reference to FIG. 2, an exemplary system 200 for analysis of an electrochemical system, such as battery 202, is shown. Battery 202 may generally be an energy storage device (e.g., a lithium-ion cell) without limitation, even though particular types of battery cells may be referred to in specific examples for the sake of elucidation of aspects disclosed herein.

Sensors 216 may be coupled to battery 202 to detect non-acoustic data related to battery 202, such non-acoustic characteristics comprising temperature of battery 202, external or environmental temperature, etc. Battery management system 208 represents a controller for operating (e.g. charging-discharging) battery 202 and may be connected to battery 202 through terminals of battery 202. Correspondingly, battery management system 208 may also be used to detect other non-acoustic data related to battery 202, such as the voltage applied to battery 202.

A pair of transducers 204, 206 are shown to be in contact with two locations (e.g., on opposite sides) on the surface of battery 202. Transducers 204, 206 may be affixed to battery 202 through any coupling mechanism, such as a separate holder or integrated transducer system. While transducers are shown and described in this example, it will be understood that one or both of transducers 204, 206 may be substituted by the various other devices for transmitting and/or receiving acoustic signals, as discussed above.

An acoustic signal generator and sensing mechanism (either separate or combined blocks thereof) is representatively shown as ultrasonic pulser-receiver 210 coupled to transducers 204, 206. Based on the control of ultrasonic pulser-receiver 210, one of transducers 204, 206 may be configured to transmit ultrasonic signals while one or both of transducers 204, 206 may be configured to receive responses generated from the transmitted, reflected or refracted ultrasonic signals. Transducer 204 is shown as a transmitter (T) and transducer 206 is shown as a receiver (R) for the sake of illustration of one aspect in FIG. 2. Battery management system 208 may provide control signals to ultrasonic pulser-receiver 210 to cause the generation/sensing of ultrasonic signals to be performed as above.

In FIG. 2, computer 224 is also shown in conjunction with the above blocks. Separate blocks of computer 224 are illustrated for describing exemplary aspects, while it will be understood that the functionality of the different blocks of computer 224 may be implemented in any suitable combination of hardware and software elements. In one example, waveforms of acoustic signals measured by ultrasonic pulser-receiver 210 form the above-mentioned acoustic data. The acoustic data is sent to computer 224 along with the non-acoustic data from sensors 216, battery management system 208. In block 212, an optional conditioning step may be performed, wherein the acoustic data may be windowed, resampled, filtered, etc., to generate a conditioned dataset. The conditioned dataset is sent to block 214, wherein the reduced acoustic dataset is generated (alternatively, the reduced acoustic dataset may be generated from the acoustic data if block 212 is not present). Block 214 may implement various signal analysis techniques, feature extraction, and feature selection in the generation of the reduced acoustic data set, example processes of which will be discussed in detail in the following sections, e.g., with reference to FIGS. 4A-B. The reduced acoustic dataset from block 214 is then combined with the non-acoustic data from sensors 216 (e.g. cell temperature, environmental temperature), battery management system 208 (e.g. charge/discharge rate, voltage, cell impedance), etc., and fed into block 218, which has a two-way communication shown with block 220 comprising a library/database of known system operating conditions and parameters, e.g., reduced acoustic datasets from other batteries, non-acoustic data, etc. The database/library in block 220 may be constructed with the machine learning, correlations and physical models explained further below. The received acoustic dataset from block 214 and non-acoustic data from sensors 216 and battery management system 208 are compared or correlated with the library/database from block 220. This produces a prediction 222 of the characteristics of battery 202, e.g., SOC, SOH, cell safety margin, remaining life, material properties, quality of manufacture, etc. Prediction 222 may also be fed back in to the battery management system 208 to provide information to optimize the operation of battery 202 in some aspects.

An application of the elastic wave propagation theory in the system of FIG. 2 will now be explained. In an example, transducer 204 may be a transmitter (also referred to as a pulser) of ultrasonic or acoustic signals, and configured to transmit a signal, e.g., in an ultrasonic frequency through battery 202. The shape of the transmitted signal may be an enveloped sinusoidal compressional pulse in one example, while in other shapes such as a square wave, any other type of sinusoidal wave, etc., may also be used. The response to the transmitted signal may be received by transducer 206. The transmitted signal propagates through battery 202, which may comprise several thin material layers with thicknesses in the tens of microns (i.e., anodes, cathodes, separators, current collectors, etc.). Certain layers of battery 202 such as the anode, cathode, separators, etc., are generally porous materials, and in a well-constructed battery the pores are filled with electrolyte (typically, but not exclusively, a liquid or fluid electrolyte). The propagation velocity of the transmitted acoustic signal, e.g., in the shape of a compressional wave, in each layer depends on the material properties of the layers through which the wave travels. For an isotropic elastic material, the velocity of the transmitted signal is shown in Equation 1 of FIG. 1A, wherein K and G are the material bulk and shear moduli respectively, and p is the material density. At interfaces between the layers the waves of the transmitted signal may be in part reflected and in part transmitted, the transmission and reflection being dependent on a degree of mismatch between the acoustic impedances of the two materials/layers forming the interface. Acoustic impedance is also dependent on physical properties of the materials, such as density and propagation velocity. Any waves striking an interface at an angle may undergo mode conversion and partially propagate as shear waves. In an example, wherein transducer 204 is a compressional wave transducer, the response signals may be measured a pair of aligned transducers (representatively, transducer 206), wherein the aligned transducers may measure contributions from the compressional waves (and in relevant cases, also the shear waves).

Wave behavior through a finely layered structure such as a lithium ion battery is recognized to differ from that through a non-finely layered structure. For waves with wavelength $\lambda$, much larger than the layer thickness, l, (ie $\lambda \gg l$), the propagation speed through the complete thickness may be significantly different from the wave propagation speed that would be expected for waves propagating through a simple aggregation of the layers at their average wave-speed. Differences of the order of 20% or more in wave speeds are not uncommon, which is referred to as Backus averaging. Due to such effects, the arrival time at transducer 206 of the first wave transmitted from transducer 204 through battery 202 comprising a finely layered structure, for example, may be delayed, in comparison to its expected arrival time based on a simple aggregation of layers. In aspects of this disclosure, the above differences between wave arrival times based on different layer compositions may be ignored or overlooked by focusing on changes in wave propagation times (e.g., time of flight (TOF) shifts) rather than on the absolute wave arrival times (e.g., TOF). The TOF shift provides an example of a reduced acoustic data, as it is representative of, yet significantly simpler than, the wave propagation times for the entire waveform. The TOF shifts may be determined for different electrochemical states, e.g., states of charge, of battery 202 and collected/stored as the reduced acoustic dataset. The use of the reduced acoustic dataset, rather than the first arrival times in creating and utilizing the full acoustic dataset, is also advantageous in its potential to ignore or overlook variations due to the Backus averaging effects. In some aspects, due to the Backus averaging, relative changes in other acoustic features such as relative changes in centroid frequency (rather than absolute centroid frequency values) of the acoustic signals may also be used to form the reduced acoustic dataset, in addition to or in lieu of the TOF shifts discussed above.

Further, physical properties of battery 202 may also be used in the generation of the reduced acoustic dataset. For example, using known or predetermined values for the mechanical properties of the cathode and anode active materials, binder and conductive additives, etc., of battery 202, a series of values for the physical properties of the battery, such as the bulk and shear moduli of the composite electrodes of battery 202 may be determined at varying states of charge supplied by battery management system 208. Battery management system 208 may be configured to subject battery 202 to the charge-discharge cycle based on prediction 222 received from computer 224 as described previously. These physical properties comprising the series of bulk and shear moduli, for example, may also be used in determining the reduced acoustic dataset such as TOF shifts, in some example aspects.

In more detail, from the elastic modulus and Poisson's ratio, a material's bulk and shear moduli may be estimated according to Equations 2 and 3 of FIGS. 1B-C, respectively, wherein K and G are the bulk and shear moduli respectively, as previously stated, and v is the Poisson's ratio. In example aspects, the materials of battery 202 are assumed to be isotropic, or an aggregate of randomly oriented polycrystals which are effectively isotropic. The positive and negative electrodes of battery 202 are typically porous composites of active material, binder, and conductive additives filled with electrolyte. Based on this, it is possible to estimate effective electrode stiffness using effective media models for composite materials (from the geophysics or materials science communities). As an example, Hashin-Shtrikman bounds provide a tighter bound on properties than the Voigt and Reuss bounds for composite materials. The Hashin-Shtrikman bounds represent the composite as being made up of an aggregation of spheres and shells of the constituent materials, as described below.

Equations 4-7 of FIGS. 1D-G describe the maximum and minimum bounds for the bulk and shear moduli of the composite electrodes, based on the properties of the constituent components. In order to estimate a single value of each of the moduli for theoretical calculations, an average of the maximum and minimum HS bounds for bulk and shear moduli is calculated in one example process. At each SOC state of battery 202 under study, the physical properties comprising the bulk and shear moduli are calculated for each composite electrode or layer. The bulk and shear moduli vary with the SOC as the properties of the constituent materials vary. Equation 1 may then be used to determine the primary wave speed for each SOC. The change in the wave propagation time, or TOF shift, is then correlated with the SOC.

Equations 8-10 of FIGS. 1H-J are the functions lambda, gamma and zeta referenced in Equations 4-7 above. In Equations 8 and 9, the terms K(r) and G(r) represent the spatially varying moduli of the constituent material through the electrode. The variable z is generated by the respective equation. In the case of Equations 6-7 this variable is also a function of zeta. The expectation value calculation in Equations 8 and 9 is a volume fraction weighted average.

Physically, the maximum and minimum analytical values of the bulk and shear moduli may depend on which of the constituent materials form the sphere or shells of the composite material of battery 202, but these maximum and minimum analytical values are not germane to the discussion herein.

Figure 3A:
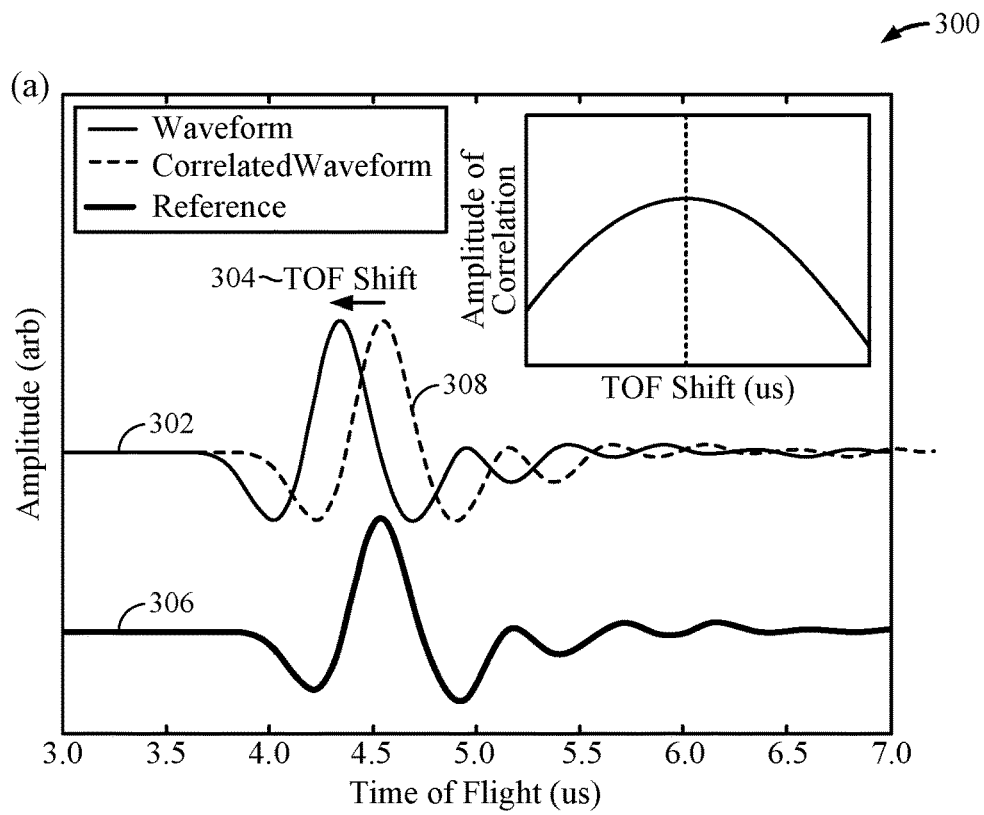
FIGS. 3A-B illustrate correlations between features of acoustic signals transmitted through a battery, according to aspects of this disclosure.
Figure 3B:
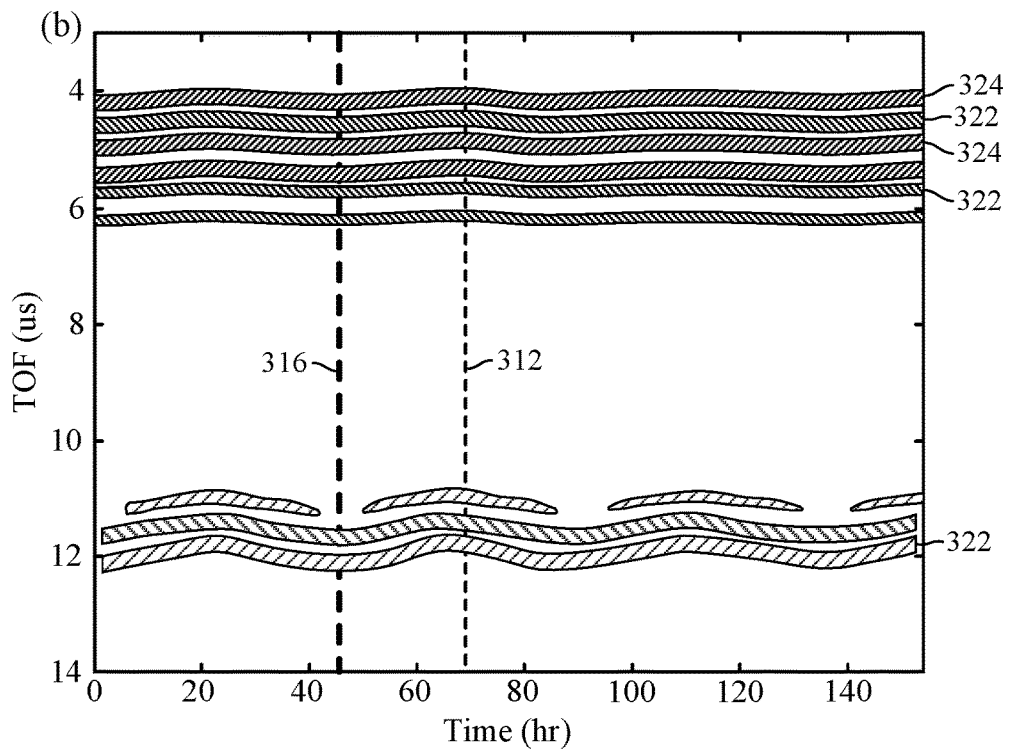

With reference now to FIGS. 3A-B, an example application of the above concepts is shown. Specifically, FIGS. 3-AB show a time of flight (TOF) determination technique 300, wherein a response signal 302 (e.g., received at transducer 206 in response to an ultrasonic signal transmitted by transducer 204 through battery 202 at a given/known SOC) is correlated with a reference signal 306 for all time shifts τ, to generate correlated waveform 308. In FIG. 3A, a plot of amplitude of the various waveforms 302, 306, 308 are shown as a function of TOF. At the point of best correlation (i.e., for τ, wherein the amplitude of correlated signal 308 is a maximum), TOF shift 304 is calculated. TOF shift 304 is then correlated to the corresponding SOC of battery 202.

FIG. 3B shows a heat map of TOF as a function of time. FIG. 3B illustrates the evolution of the ultrasonic signals transmitted through battery 202 as it cycles through charges, controlled by battery management system 208. Lines 312 and 316 represent points in time at which respective reference and correlated waveforms 302 and 308 of FIG. 3A are taken. Plots identified with the reference numeral 322 represent positive amplitudes, while plots identified with the reference numeral 324 represent negative amplitudes in the heat map.

To determine the shifts in the waveforms while battery 202 under test is charge cycled, a cross correlation technique may be used, wherein waveform data is first interpolated (e.g. with a cubic spline fit) to upscale discretized data and allow for a more accurate TOF determination. Reference signal 306 may be selected as a zero point reference for the cross-correlation and determination of TOF shifts of subsequent waveforms. Alternatively, any point during a charge cycle may be selected as the SOC at which reference signal 306 is obtained, since the above shifts are relative.

Thus, each snapshot for the heat map generation above may be shifted in time against the selected reference signal 306, and an area of the product of the curves is calculated for all TOF shifts 304. Equation 11 of FIG. 1K demonstrates the cross-correlation calculation for a given TOF shift 304. The point of maximum correlation is determined, i.e. the τ for which the integral is at its maximum. This point of maximum correlation provides an accurate measure at which TOF shift 304 may be calculated as discussed above. For sign convention, positive TOF shifts indicate that a current waveform 302 has a longer TOF than the reference signal 306 and negative TOF shifts indicate that the current waveform 302 has a shorter TOF than the reference signal 306. FIG. 3A shows the cross-correlation technique graphically. Although the correlation may be performed using a complete set of measurements, it is possible to use a subset of the dataset to obtain the TOF shifts discussed above.

In some aspects, the total signal amplitude of the response signal 302 may be measured, in addition to or in lieu of the TOF shift measurements discussed above. The total signal amplitude may be determined by integrating an absolute value of the signal amplitude at each time instance, over the full waveform, as represented in Equation 12 of FIG. 1L, wherein A is the total amplitude of the waveform, f(t) is the waveform, and ti to tf is the waveform measurement window.

Accordingly, based on the acoustic data, or more specifically, the reduced acoustic dataset, the characteristics of battery 202 may be predicted, such characteristics comprising one or more of the SOC, SOH, state of power, state of safety, quality of construction, etc., of the battery. In addition or as an alternative to the total signal amplitude or TOF shifts discussed above, the reduced acoustic dataset may include one or more of a first break time (i.e., the time at which the response from the input signal first arrives at receive transducer 206); centroid frequency (i.e., the mean intensity-weighted frequency of the response signal); full width at half the maximum of the main response peak in time domain; full width at half the maximum of the main peak in the frequency domain; standard deviation, skewness, or kurtosis of the frequency distribution; decay rate of the response signal in time domain; or other metrics in the time domain such as, the area under positive amplitude, area under negative amplitude, etc. The reduced acoustic dataset may be used in conjunction with the non-acoustic data such as voltage of the battery, temperature (e.g., ambient temperature as well as cell temperature (surface and internal)), internal resistance, total capacity that has passed through the battery, battery thickness, etc., in constructing and using a machine learning technique, as will be explained further below.

An example machine learning technique is referred to as a support vector regression (SVR) method. In this disclosure, machine learning techniques such as the SVR method utilize a training set as an input, wherein the training set may include the acoustic dataset or in exemplary aspects, the reduced acoustic dataset, optionally in conjunction with the non-acoustic data. The training set may also include the physical properties that are estimated from analysis of the acoustic data based on elastic wave propagation theory discussed above. In some cases, the training set may be normalized. For example, normalizing the reduced acoustic dataset may mean that the input vectors fall between 0 and 1. Where the acoustic data from the full waveforms are used for training, normalizing the training data may mean that the input vectors fall between −1 and 1.

Figure 4A:
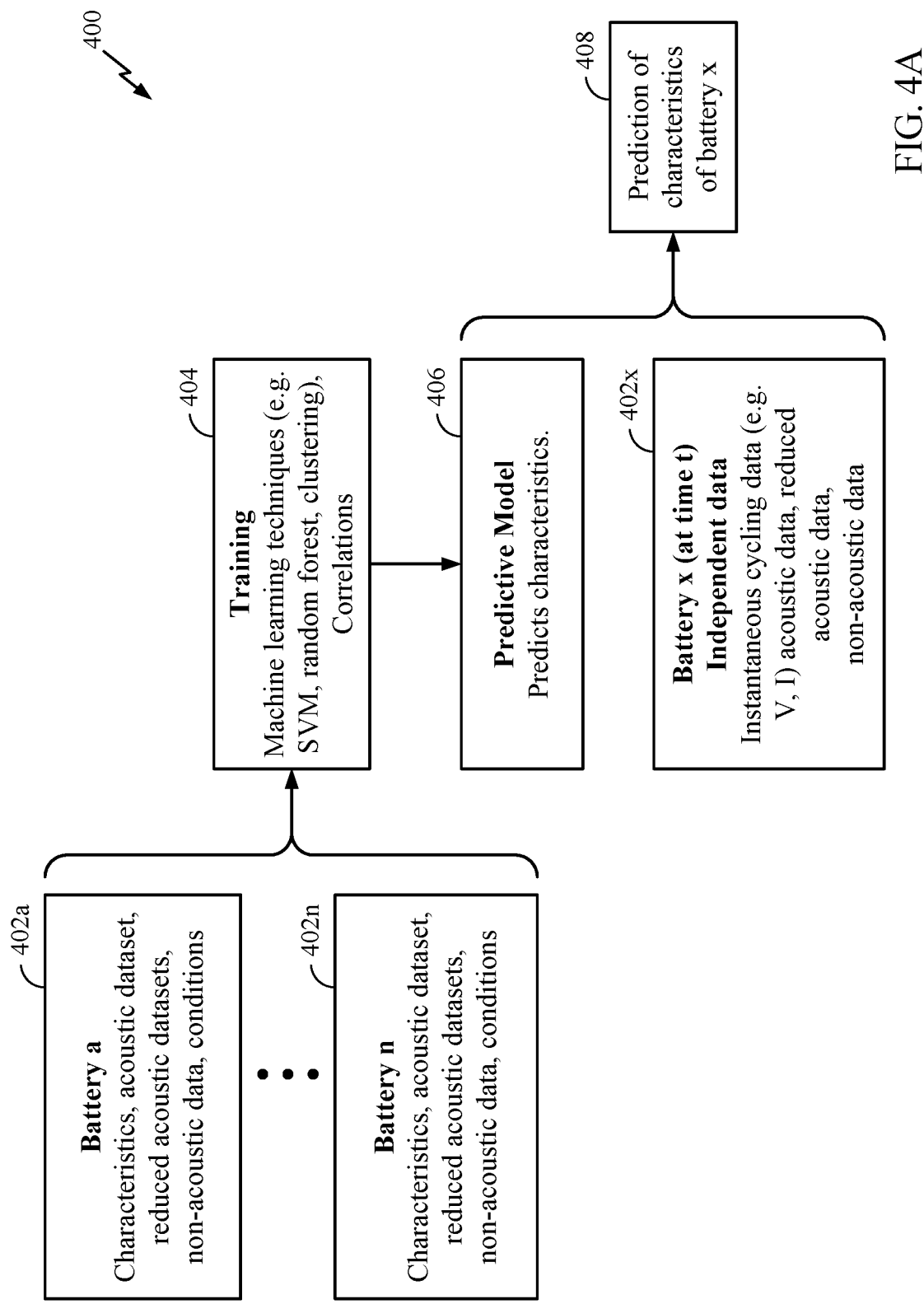
FIGS. 4A-B illustrate methods for predicting characteristics such as SOC, SOH of batteries using machine learning models, according to aspects of this disclosure.

FIG. 4A illustrates a schematic of the method 400 predicting characteristics such as SOC, SOH, etc., of a battery 402$x$ using machine learning techniques. One or more training batteries 402$a$-$n$ may be used for generating input datasets. The input datasets may be trained using training model 404. Based on predictive model 406, and input data for battery 402$x$, the characteristics of battery 402$x$ may be predicted in block 408.

In further detail, the input datasets of each of batteries 402$a$-$n$ may include any one or more of the characteristics, acoustic datasets, reduced acoustic datasets, non-acoustic data, physical properties, and conditions (e.g., gassing, failure, etc.) of the respective batteries. For battery 402x to be predicted, input data such as instantaneous cycling data (e.g., voltage, current, etc.), acoustic data, reduced acoustic data, non-acoustic data, physical properties, etc., may be obtained. Training model 404 may use machine learning techniques (e.g., SVM, random forest, clustering, etc.), determine correlations between the input datasets from batteries 402a-n, apply dimensionality reduction algorithms, etc. Predictive model 406 may predict the desired characteristics based on the above input datasets and information from training model 404 to generate the predictions of characteristics (e.g., e.g. SOC, SOH, safety margin, gassing, manufacturing quality, etc.) of battery 402x in block 408.

Figure 4B:
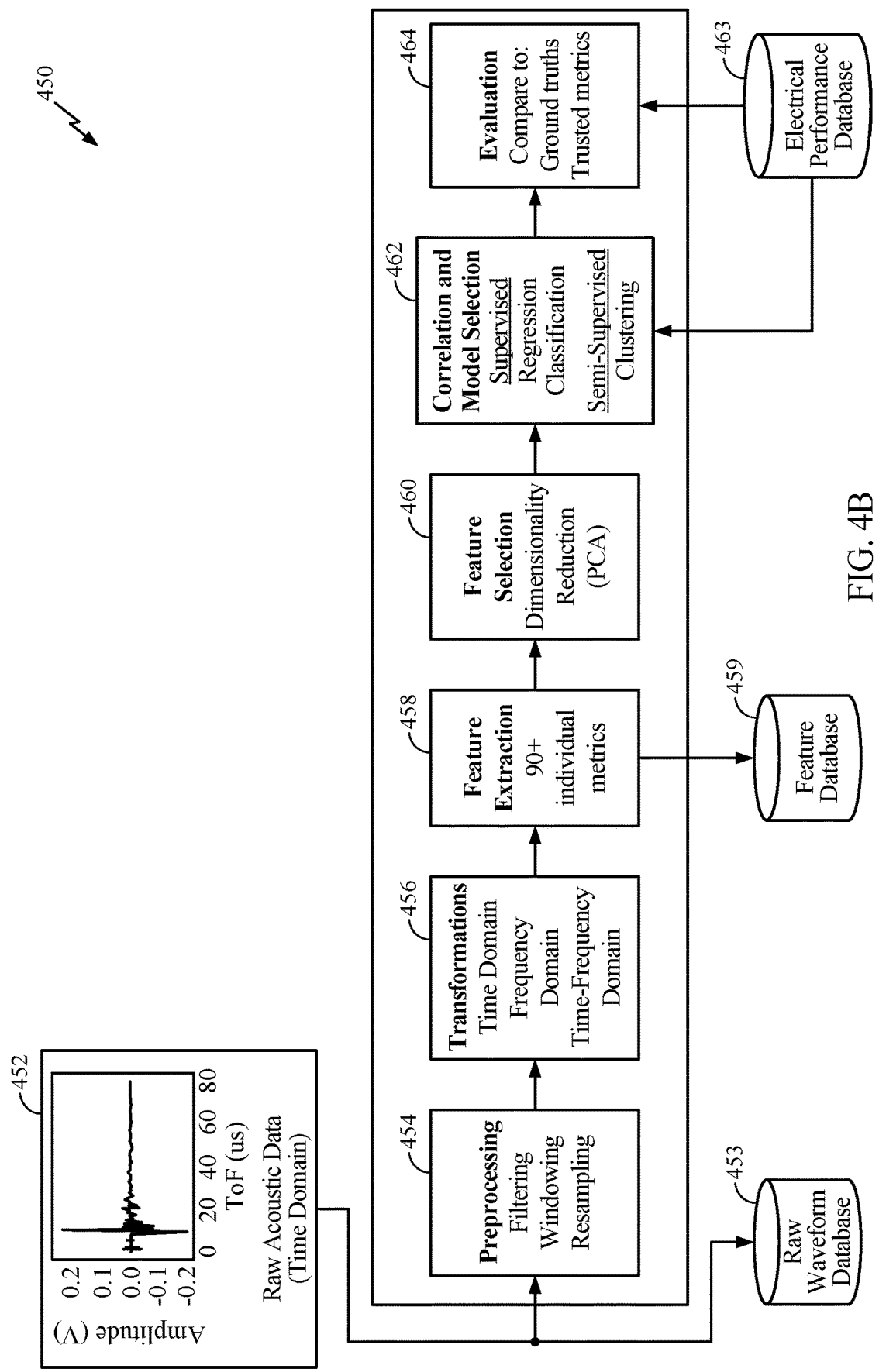

FIG. 4B illustrates an example of the machine learning used in method 400, designated as 450. In method 450, raw acoustic data 452 (e.g., full wave forms in time domain) are collected from batteries 402a-n, for example, and stored in database 453, along with pertinent metadata. Before extracting reduced acoustic data such as TOF shifts and total signal amplitude, the raw acoustic dataset 452 may be preprocessed in block 454, which may include windowing, filtering, resampling, etc., to correct for possible equipment noise and improve resolution. With respect to the acoustic dataset 452, the signal amplitude at the beginning and end of a measurement time window is recognized to be effectively zero, which means that the contribution to the various metric changes from waves shifting into and out of the measurement window is negligible. Therefore, simplifying the acoustic dataset to the reduced acoustic dataset comprising measurements of changes in the waveforms in a region of interest can simplify the training data.

In block 456, transformations of time series into frequency spectra and time-frequency spectrograms may be performed to facilitate the extraction of features forming the reduced acoustic dataset such as the frequency content, dispersion, TOF shifts, total signal amplitude, etc., in block 458.

In block 458, in addition to TOF shifts and total signal amplitude, numerous other reduced acoustic dataset features may be extracted from time-, frequency-, and time-frequency domains, comprising, for example statistical (e.g., mean, variance, skewness), time-domain (e.g., first-break time, root mean square amplitude), spectral (e.g., centroid frequency, spectral width), and high-level (e.g., entropy, complexity, Hurst exponent) descriptors. These extracted features may be stored in feature database 459.

Subsequent to feature extraction for generation of the reduced acoustic dataset, a selection block 460 may be used to minimize or eliminates noisy or irrelevant features. In this block model-based methods and dimensionality-reduction algorithms (e.g., principal components analysis (PCA)) may be used to generate further simplified/condensed datasets, which are evaluated in the machine-learning step.

The machine learning block 462 may include one implementation of a combination of training model 404 and predictive model 406 of FIG. 4A. Block 462 may be configured for one or more of the following example functions: to predict characteristics such as capacity fade, SOC, SOH, or remaining useful lifetime of a battery from acoustic features and to classify batteries by construction quality, defect or degradation state, or general usability based on acoustic similarities. The first aspect of predicting the SOC may be performed using supervised learning. For the regression techniques used for predicting the SOC, etc., a mean squared error (MSE) and coefficients of determination may be used to measure the prediction accuracy.

The second aspect of classifying the batteries may involve supervised classification problem and unsupervised clustering. For the supervised classification, electrical metrics such as capacity fade and resistance may first be transformed into a set of discrete labels such as class A, B, and C, and fed into machine learning pipelines. Alternatively, the batteries may be grouped or clustered based upon acoustic features, and electrical metrics may be used as a ground truth to interpret the clustering results. For all of the above, machine learning techniques such as random forest, support vector machine (SVM), etc., may be utilized.

Figures 5A, 5B:
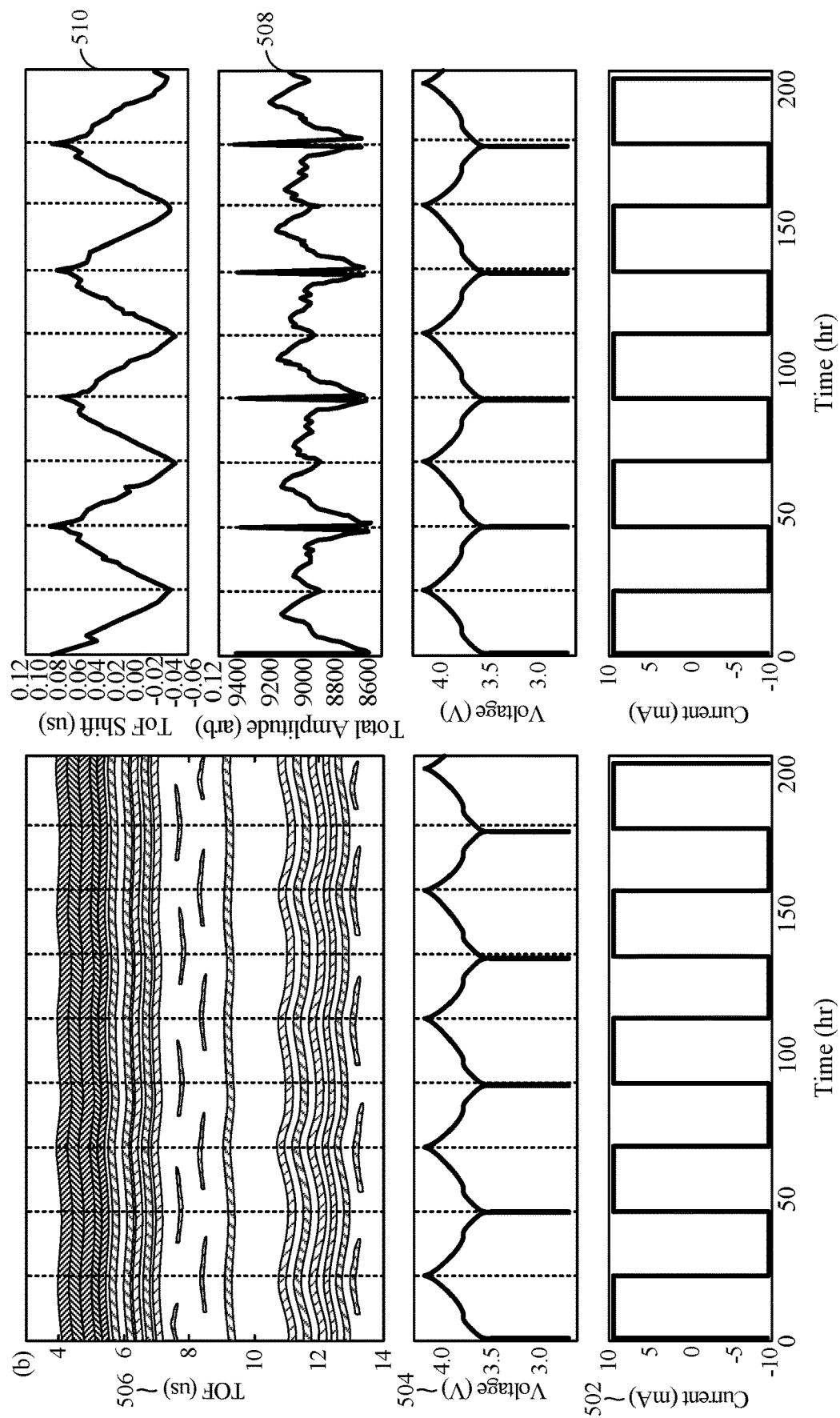
FIGS. 5A-B illustrate correlations between features of acoustic signals transmitted through a battery and non-acoustic data, according to aspects of this disclosure.

With reference to FIGS. 5A-B, example advantages of using the reduced acoustic datasets will be described. FIG. 5A shows values of current 502 and voltage 504 measured across a battery under test (e.g., battery 202) during charge-discharge cycles and also a corresponding acoustic dataset comprising TOF values 506. As seen, there are clear and repeatable trends in the TOF values 506, which vary periodically, synchronized with the electrochemical charge cycling. A waveform shift is seen in TOF values 506 of FIG. 5A, wherein as the battery charges (i.e., voltage 502 increases), the waveform of TOF values 506 shifts to a lower TOF, with TOF 506a representatively shown as a low point (noting that TOF values increase from the top to the bottom in this representation) corresponding to a highest voltage value during a cycle. As the battery discharges (i.e., voltage 502 decreases), the waveform of TOF values 506 shifts to a higher TOF, with TOF 506b representatively shown as a high point in the same cycle. Accordingly, the waves representing TOF values 506 are seen to move towards lower TOF values during charging and towards higher TOF values during discharging of the battery.

FIG. 5B shows the reduced acoustic dataset comprising total signal amplitude values 508 (e.g., using the above-described integration techniques) and TOF shift values 510 (e.g., using the above-described cross-correlation techniques) for the same charge-discharge cycles shown in FIG. 5A, but replacing the acoustic dataset comprising TOF values 506. The waveforms for the reduced acoustic dataset comprising total amplitude values 508 and TOF shift values 510 are seen to better demonstrate the shifts that occur during cycling, while also showing their repeatable and periodic nature.

With reference now to FIGS. 6A-D, correlations between TOF shift and SOC will be discussed in further detail. FIG. 6A shows the relationship between TOF shift (y-axis) and battery capacity (x-axis) for a single, representative cycle. Progressing from top of charge, the overall waveform for TOF shift is seen to increase as charge decreases (discharge 602), and the overall waveform for TOF shift is seen to decrease as the charge increases again (charge 604). As such, a hysteresis is apparent in the TOF shift during a particular charge/discharge cycle. Toward the end of discharge 602 there is seen to be a plateau in the TOF shift, following which the TOF shift undergoes a "double-dip" pattern identified as 606 in FIG. 6A, prior to rapidly spiking as the battery discharges (i.e., capacity tends to 0 mAh on the x-axis).

FIG. 6B illustrates an aggregation of the TOF shifts of FIG. 6A, over a plurality of charge-discharge cycles for an exemplary battery under test. Specifically, discharge 602 is identified to illustrate that the waveform follows substantially the same pattern or general trend during each cycle. An apparent evolution over cycles involves a shift of the waveform to higher TOF values across the different cycles. This shift may be correlated to characteristics such as SOH of the batteries.

FIGS. 6C-D similarly show total signal amplitude 608 (y-axis) as a function of SOC (x-axis) for a single charge-discharge cycle (FIG. 6C) and aggregated over a plurality of cycles (FIG. 6D). Similar to the TOF shifts in FIGS. 6A-B, intra-cycle repeatable trends are observed total signal amplitude 608. There is an observed significant drop off in the total signal amplitude 608 shown below approximately 25% of SOC, followed by a spike in total signal amplitude 608 at the bottom of charge, identified by reference numerals 610a-b. The significant and rapid change in the TOF shift at 606 in FIG. 6A and the change in total signal amplitude 608 at 610a-b indicates that significant structural changes occur at these SOC values. These rapid changes 606, 610a-b are seen to indicate over-discharge of a battery. Thus, monitoring the combined TOF shift and total signal amplitude measurements for such rapid change may be used to provide an indication of the onset of over-discharge in battery management systems, for example. Further, total signal amplitude 610 viewed across cycles in FIG. 6D provides an indication that the total signal amplitude 610 fades slightly as the battery is subjected to an increasing number of charge-discharge cycles.

From the above observations of the repeatable nature of the reduced acoustic dataset comprising TOF shifts and total signal amplitude, it is seen that the reduced acoustic dataset may be used to accurately predict characteristics such as SOC, SOH, etc., of batteries. Specifically, the intra-cycle electrochemical changes, and therefore mechanical properties of the material, give rise to the shifts that are observable in the ultrasonic waveforms during charge cycling of batteries. The electrochemical-mechanical coupling is seen to provide a basis for the above predictions using acoustic data derived from the ultrasonic signals. Furthermore, given that the material properties shift continuously through cycling, there is also provided an ability to distinguish clear changes in the material state of the battery (which is contrasted with electrochemical measures, such as voltage, which may only display very small changes that are difficult to observe). The following sections discuss additional aspects of SOC prediction and signal changes as SOC varies.

In addition to the above-noted repeatable trends both in TOF shifts and total signal amplitude with respect to the SOC of the battery, same or similar trends are also observed across multiple batteries. However, cell variability and noise during measurement may lead to some variations which may complicate direct inference of SOC of a battery with respect to inputs of total signal amplitude and TOF shifts. With an aggregation of the available measured dataset including the total signal amplitude, TOF shift, and other non-acoustic data described above such as the voltage, exemplary aspects involve an estimation of the SOC of a battery while overcoming the complications based on the variations noted above.

As previously noted, the machine learning techniques of methods 400, 450 shown in FIGS. 4A-B may use input data from two or more batteries 402a-n to predict characteristics of battery 402x. This manner of using methods 400, 450 provides independent verification of the accuracy of these machine learning models, without requiring the algorithm to be trained on battery 402x itself, for which predictions are being made. Predictions of characteristics of battery 402x may be made at each point in time for which the input dataset included the training data. As also previously noted, the TOF shift and total signal amplitude may be normalized to fall between the values 0 and 1. With these normalized values for a point in time from batteries 402a-n, the instantaneous SOC of battery 402x for that point in time may be predicted without requiring data from previous time instances during cycling. These exemplary techniques are distinguished from conventional methods such as coulomb counting which may rely more heavily on history/data from other previous time instances as well in making predictions of SOC. That the exemplary techniques are not similarly dependent on history provide advantages in terms of robustness in exemplary SOC predictions, relying on less information for higher accuracy predictions, and not being dependent on previous knowledge of the charge-discharge history or condition of the battery. Furthermore, the above-noted techniques for SOC prediction are also seen to be robust, even in the event of unexpected and untrained cycling histories or possible cell damages.

In addition to predicting the SOC, other characteristics such as the SOH of a battery, e.g., battery 402x, may also be predicted using the input/training dataset. For instance, the SOH may be predicted using data from the top of charge of each cycle, referring to FIG. 6A, for example (although not discussed in detail, the SOH predictions may also be made at other intermediate states of charge). For SOH predictions, a similar method such as method 400 may be used, wherein the inputs for training model 404 in this case may comprise the TOF shift correlated to a single cell reference signal (e.g., for battery 402a at the top of charge during a cycle), the total signal amplitude, voltage, and other acoustic data referred to as an ultrasonic snapshot. The ultrasonic snapshot may comprise TOF offsets removed such that the snapshots overlay each other and capture the evolution of the snapshot shape without the TOF shift. The ultrasonic snapshot maybe normalized, e.g., to the range [−1,1], and the remaining parameters may be normalized to the range [0,1]. For each battery, there may be a variation in the absolute time of arrival of the waveform, which may be based on thickness variations in the battery, packaging or material differences, variations in the attachment of the transducers to the battery, etc. The amplitude of the waveform may also, with the amplitude of a battery being based on similar characteristics of the cell as discussed above with respect to the time of arrival. Accordingly, direct comparison of acoustic data (e.g., time of arrival, amplitude, etc.) is difficult. To reduce errors and allow for better waveform comparison, the waveforms at the top of charge may be normalized back to a single time of arrival (i.e., the waveforms from different cells will appear to arrive at the same time once normalized or in other words, the waveforms are all overlaid). In addition, the amplitude of the waveforms are normalized to fall between −1 and 1, so variations in amplitude are also eliminated. As a result, the various waveforms will appear overlap with respect to their bulk acoustic data (e.g., arrival time, amplitude), but the differences in the waveform shape, etc., will be revealed by the reduced acoustic dataset. Training an independent battery 402x may proceed as outlined in the preceding sections.

Since the ultrasonic signals are sensitive to structural differences in the battery through which they travel, as previously discussed, the exemplary techniques may be used for in various aspects of battery management, second-life applications (i.e., repurposing), pack refurbishment, development and monitoring of battery manufacturing or assembly processes, and faulty cell identification. The SOH prediction may also be performed with only a single ultrasonic measurement, e.g., taken at a time instance corresponding to the top of charge of the battery, which means that knowledge of the history of the battery is not needed. However, it will be understood that the SOH prediction may also be performed while the battery is not in use, and as such does not require any charge level or charging condition for exemplary aspects discussed herein. Accordingly, the exemplary techniques lead to low cost and high accuracy solutions.

Figure 7:
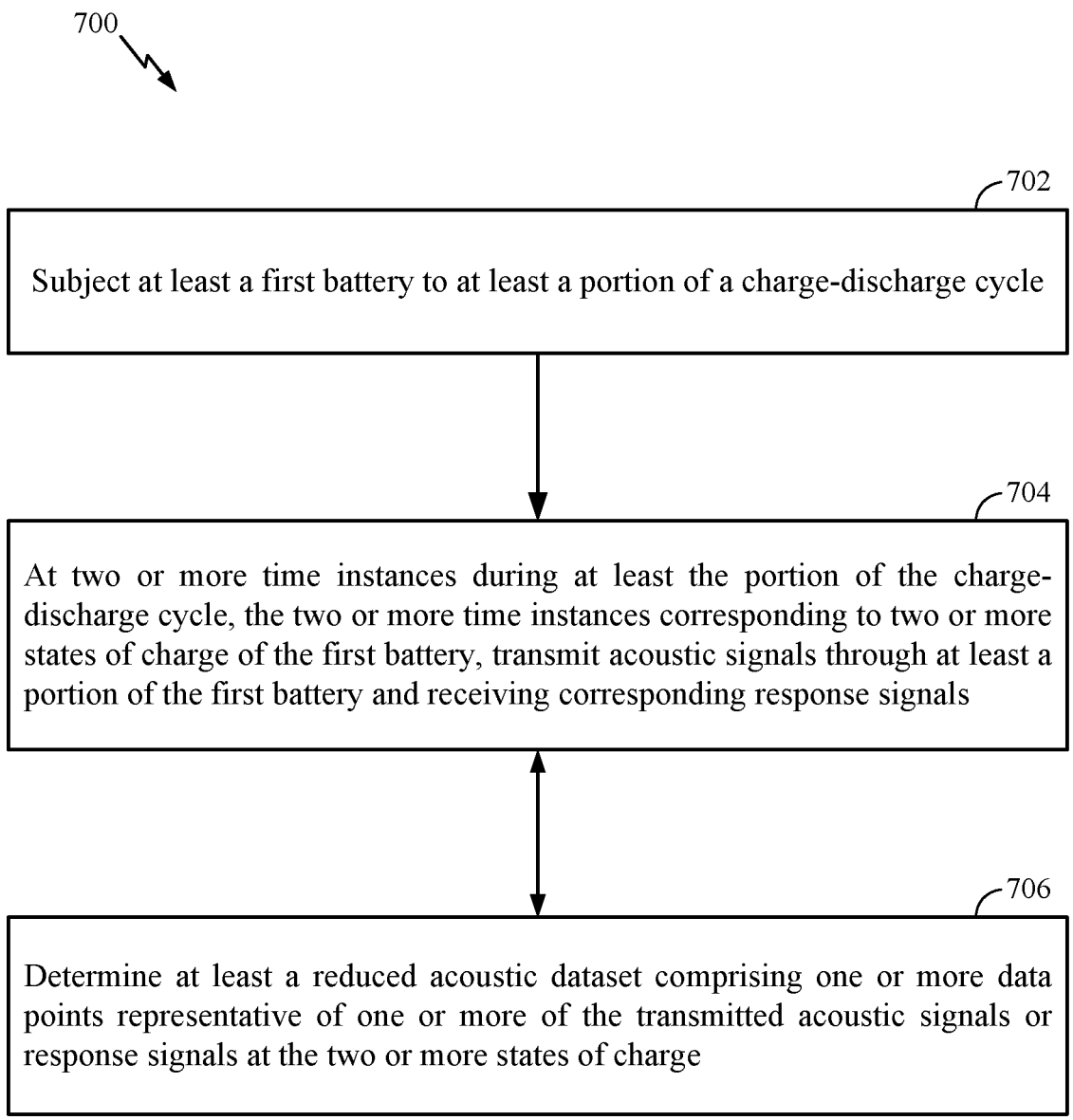
FIG. 7 illustrates an exemplary method of non-invasive analysis of a battery, according to aspects of this disclosure.

Accordingly, it will be appreciated that exemplary aspects include various methods for performing the processes, functions and/or algorithms disclosed herein. For example, FIG. 7 illustrates a method 700 of non-invasive analysis of electrochemical systems.

Block 702 of method 700 may comprise, subjecting at least a first battery to at least a portion of a charge-discharge cycle (e.g., subjecting battery 202 or 402a to a charge-discharge cycle using battery management system 208).

Block 704 comprises, at two or more time instances during at least the portion of the charge-discharge cycle, the two or more time instances corresponding to two or more states of charge of the first battery, transmitting acoustic signals through at least a portion of the first battery and receiving corresponding response signals (e.g., using transducers 204, 206 for transmitting, receiving acoustic signals, and creating an acoustic dataset as shown in FIGS. 3A-B).

Block 706 comprises determining at least a reduced acoustic dataset comprising one or more data points representative of one or more of the transmitted acoustic signals or response signals at the two or more states of charge (e.g., TOF shifts 510, total signal amplitude 508, as shown in FIG. 5B).

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium.

Accordingly, an aspect of the invention can include a computer-readable media embodying a method for analyzing electrochemical systems using acoustic signals. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method of non-invasive analysis of electrochemical systems, the method comprising:
   subjecting at least a first battery to at least a portion of a charge-discharge cycle;
   at two or more time instances during at least the portion of the charge-discharge cycle, the two or more time instances corresponding to two or more states of charge of the first battery, transmitting acoustic signals through at least a portion of the first battery and receiving corresponding response signals;
   determining a first acoustic dataset based at least in part on the transmitted acoustic signals and the response signals at the two or more states of charge;
   generating a second acoustic dataset based on the first acoustic dataset, the second acoustic dataset being a smaller dataset of response signals compared to the first acoustic dataset; and
   determining one or more physical characteristics of a first battery using at least the second acoustic dataset.

2. The method of claim 1, wherein the second acoustic dataset comprises one or more data points related to the acoustic signals, each one of the one or more data points corresponding to one of a total signal amplitude, frequency content, first break time, centroid frequency, full width at half of a maximum of a main response peak in time domain, full width at half of a maximum of a main peak in frequency domain, standard deviation, skewness, or kurtosis of frequency distribution, decay rate of the response signal in time domain, area under positive amplitude, or area under negative amplitude of the acoustic signals.

3. The method of claim 1, wherein the one or more physical characteristics of the first battery are determined at the two or more states of charge, the one or more physical characteristics comprising one or more of density, elastic modulus, bulk modulus, shear modulus, porosity, or thickness of the first battery.

4. The method of claim 1, further comprising:
   creating a first database with at least the second acoustic dataset for the first battery.

5. The method of claim 4, further comprising:
   including, in the first database, non-acoustic data related to the first battery, the non-acoustic data comprising one or more voltage, current, or temperature of the first battery at the two or more states of charge.

6. The method of claim 5, further comprising:
   including, in the first database, one or more waveforms of the transmitted acoustic signals or the response signals at the two or more states of charge.

7. The method of claim 6, further comprising:
   determining one or more characteristics of a second battery using at least the first database and one or more of acoustic data, or non-acoustic data of the second battery.

8. The method of claim 7, wherein the one or more characteristics of the second battery comprise one or more of a state of charge (SOC), state of health (SOH), construction quality, remaining useful lifetime, state of power, or state of safety.

9. The method of claim 7, further comprising:
training a machine learning model with at least the first database used as a training dataset; and
determining the one or more characteristics of the first battery or the second battery using the machine learning model.

10. The method of claim 1, wherein
the acoustic signals comprise ultrasonic signals or elastic waves,
the acoustic signals are transmitted by one or more transducers, and
the response signals are received by one or more transducers.

11. A method of non-invasive analysis of electrochemical systems, the method comprising:
predicting physical characteristics of one or more batteries using at least a first database and one or more of acoustic data or non-acoustic data of a first battery,
wherein the first database comprises at least a first acoustic dataset formed by transforming a second acoustic dataset of the first battery, the second acoustic dataset comprising one or more data points representative of one or more of acoustic signals transmitted through at least a portion of the first battery and response signals to the transmitted signals at two or more states of charge of the first battery using one or more transducers, the first acoustic dataset being a smaller dataset of response signals compared to the second acoustic dataset.

12. The method of claim 11, wherein the first acoustic dataset comprises at least a total signal amplitude of the response signals, first break time, centroid frequency, full width at half of a maximum of a main response peak in time domain, full width at half of a maximum of a main peak in frequency domain, standard deviation, skewness, or kurtosis of frequency distribution, decay rate of the response signal in time domain, area under positive amplitude, and an area under negative amplitude of the acoustic signals.

13. An apparatus comprising:
at least a first battery;
a battery management system configured to subject the first battery to at least a portion of a charge-discharge cycle;
one or more transducers configured to transmit acoustic signals through at least a portion of the first battery and receive corresponding response signals at two or more time instances during at least the portion of the charge-discharge cycle, the two or more time instances corresponding to two or more states of charge of the first battery; and
one or more processors configured to:
determine a first acoustic dataset based at least in part on the transmitted acoustic signals and the response signals at the two or more states of charge; and
transform the first acoustic dataset to generate a second acoustic dataset, the second acoustic dataset being a smaller dataset of response signals compared to the first acoustic dataset; and
determine one or more physical characteristics of a first battery using at least the second acoustic dataset.

14. The apparatus of claim 13, wherein the second acoustic dataset comprises one or more data points related to the acoustic signals, each one of the one or more data points corresponding to one of a shift in time of flight, a total signal amplitude, first break time, centroid frequency, full width at half of a maximum of a main response peak in time domain, full width at half of a maximum of a main peak in frequency domain, standard deviation, skewness, or kurtosis of frequency distribution, decay rate of the response signal in time domain, area under positive amplitude, or area under negative amplitude of the acoustic signals.

15. The apparatus of claim 13, wherein the one or more processors are further configured to generate a first database with at least the second acoustic dataset for the first battery.

16. The apparatus of claim 15, further comprising one or more sensors configured to determine a temperature of the first battery, wherein
the battery management system is further configured to determine a voltage of the first battery, and
the first database further comprises non-acoustic data related to the first battery, non-acoustic data comprising one or more of the voltage or a temperature of the first battery at the two or more states of charge.

17. The apparatus of claim 16, wherein the first database further comprises an acoustic dataset comprising one or more waveforms of the transmitted acoustic signals or the response signals at the two or more states of charge.

18. The apparatus of claim 17, wherein the one or more processors are further configured to predict one or more characteristics of a second battery based on at least the first database and one or more of acoustic data, reduced acoustic data, or non-acoustic data of the second battery.

19. The apparatus of claim 18, wherein the one or more characteristics of the second battery comprise one or more of a state of charge (SOC), state of health (SOH), construction quality, remaining useful lifetime, state of power, or state of safety.

20. The apparatus of claim 13, wherein the acoustic signals comprise ultrasonic signals or elastic waves.

* * * * *